(12) United States Patent  (10) Patent No.: US 8,369,818 B2
Chang et al.  (45) Date of Patent: Feb. 5, 2013

(54) LOW NOISE AMPLIFIER PROTECTION USING A CLAMPING DEVICE

(75) Inventors: Yuyu Chang, Irvine, CA (US); Hooman Darabi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/169,681

(22) Filed: Jun. 27, 2011

(65) Prior Publication Data

US 2012/0329418 A1  Dec. 27, 2012

(51) Int. Cl.
  *H04B 1/16* (2006.01)
  *H03F 3/45* (2006.01)
(52) U.S. Cl. ......... 455/307; 455/296; 330/252; 330/258
(58) Field of Classification Search .................. 455/217, 455/232.1, 296, 307, 308; 330/69, 252, 258
See application file for complete search history.

(56) References Cited

U.S. PATENT DOCUMENTS

| | | | | |
|---|---|---|---|---|
| 3,656,003 A | * | 4/1972 | Chen et al. | 365/209 |
| 4,161,693 A | * | 7/1979 | Carlson | 324/173 |
| 4,261,044 A | * | 4/1981 | Closson et al. | 365/8 |
| 4,777,451 A | * | 10/1988 | Tohyama | 330/253 |
| 5,973,561 A | * | 10/1999 | Heaton | 330/252 |
| 6,483,386 B1 | * | 11/2002 | Cress et al. | 330/298 |
| 6,750,663 B2 | * | 6/2004 | Patel | 324/713 |

* cited by examiner

*Primary Examiner* — Blane J Jackson
(74) *Attorney, Agent, or Firm* — Sterne, Kessler, Goldstein & Fox P.L.L.C.

(57) ABSTRACT

Embodiments of a radio frequency (RF) receiver implementing one or more forms of protection to protect devices of the RF receiver from in-band interferers is provided. The RF receiver includes an integrated circuit terminal configured to couple a RF signal received at an antenna to a RF signal path, and a low noise amplifier (LNA) coupled to the RF signal path and configured to amplify the RF signal to provide an amplified RF signal. To protect the LNA from in-band interferers, the RF receiver can further include one or more clamping circuits and/or an over-voltage detector to determine if a peak of the RF signal exceeds an acceptable level.

18 Claims, 6 Drawing Sheets

LOW NOISE AMPLIFIER PROTECTION USING A CLAMPING DEVICE

FIELD OF THE INVENTION

This application relates generally to low noise amplifiers (LNAs) and, more specifically, to the protection of LNAs.

BACKGROUND

There exist two commonly implemented front-end architectures in radio frequency (RF) receiver design; namely, the homodyne architecture and the heterodyne architecture. The homodyne architecture down-converts a desired channel directly from RF to baseband, whereas the heterodyne architecture down-converts a desired channel to one or more intermediate frequencies (IF) before down-conversion to baseband. In general, each of these front-end architectures typically employ an antenna to receive a RF signal, a band-pass filter to suppress out-of-band interferers in the received RF signal, a low noise amplifier (LNA) to provide gain to the filtered RF signal, and one or more down-conversion stages.

Each component in a receiver front-end contributes noise to the overall system. The noise of a component can be characterized by its noise factor (F), which is given by the ratio of the SNR at the input of the component to the SNR at the output of the component:

$$F_{COMPONENT} = SNR_{IN}/SNR_{OUT}$$

The noise of the overall receiver front-end increases from input to output as noise from successive components compound. In general, the overall noise factor of the receiver front-end ($F_{TOTAL}$) is proportional to the sum of each component's noise factor divided by the cascaded gain of preceding components and is given by:

$$F_{TOTAL} = F_1 + \frac{F_{2-1} - 1}{A_1} + \frac{F_{3-1} - 1}{A_1 A_2} + \ldots + \frac{F_{n-1} - 1}{A_1 A_2 \ldots A_{n-1}}$$

where $F_n$ and $A_n$ represent the noise factor and gain of the nth component in the receiver front-end, respectively. The above equation reveals that the noise factor ($F_1$) and gain ($A_1$) of the first gain component can have a dominant effect on the overall noise factor of the receiver front-end, since the noise contributed by each successive component is diminished by the cascaded gain of the components that precede it.

To provide adequate sensitivity, therefore, it is important to keep the noise factor ($F_1$) low and the gain ($A_1$) high of the first gain component in the receiver front-end. The sensitivity of the receiver front-end determines the minimum signal level that can be detected and is limited by the overall noise factor of the receiver front-end. Thus, in typical receiver designs the first gain component in the front-end is an LNA, which can provide high gain, while contributing low noise to the overall RF receiver.

LNAs provide relatively linear gain for small signal inputs. However, for sufficiently large input signals, LNAs can exhibit non-linear behavior in the form of gain compression; that is, for sufficiently large input signals, the gain of the LNA approaches zero. LNA gain compression is a common issue confronted in RF receiver design, since large out-of-band interferers referred to as blockers can accompany a comparatively weak desired signal in a received RF signal. For example, in the Global System for Mobile Communications (GSM) standard, a desired signal 3 dB above sensitivity (−102 dBm) can be accompanied by a 0 dBm blocker as close as 80 MHz away. If these large out-of-band interferers are not attenuated prior to reaching the LNA, they can reduce the average gain of the LNA. As noted above, a reduction in the gain provided by the LNA leads to an increase in the noise factor of the receiver front-end and a corresponding degradation in sensitivity.

Therefore, a band-pass filter is conventionally employed in the receiver front-end, before the LNA, to attenuate large out-of-band interferers. These filters are typically mechanically-resonant devices, such as surface acoustic wave (SAW) filters, that provide a high quality factor (Q) required by many of today's communication standards (e.g., GSM). The Q-factor of a tuned circuit, such as a band-pass filter, is the ratio of its resonant frequency (or center frequency) to its 3 dB frequency bandwidth.

Although SAW filters (and other potential, on-chip filters) can provide excellent attenuation of large out-of-band interferers and accurate pass-band location, they cannot provide protection from in-band interferers. Therefore, portions of a RF receiver front-end, disposed on a semiconductor substrate, are still susceptible to large in-band interferers.

These large in-band interferers can be as large as 25 dBm and can originate from many sources, including transmitters within close proximity of the receiver and even a transmitter associated with the RF receiver front-end (in a transceiver configuration). For example, the Extended GSM-900 uplink band ranges from 880-915 MHz and overlaps with the GSM-850 downlink band that ranges from 869.2-894.2 MHz. Thus, if a transmitter of a first device transmitting data over the Extended GSM-900 band is brought within close proximity to a receiver of a second device receiving data over the GSM-850 band, the transmissions from the first device can appear as large in-band interferers at the receiver of the second device. Without protection from these large in-band interferers, devices (e.g., transistors) within the semiconductor substrate can be exposed to over-voltages; that is, voltages which exceed design limits. This is especially true for the devices within the LNA. These over-voltage situations can accelerate aging and/or result in breakdown of devices within the RF receiver front-end. Breakdown of devices and aging effects can, in a worst case scenario, result in an unrecoverable failure of the RF receiver front-end.

Therefore, what is needed is an apparatus and method to protect RF receiver front-ends from large, in-band interferers.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the invention. However, it will be apparent to those skilled in the art that the invention, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1:
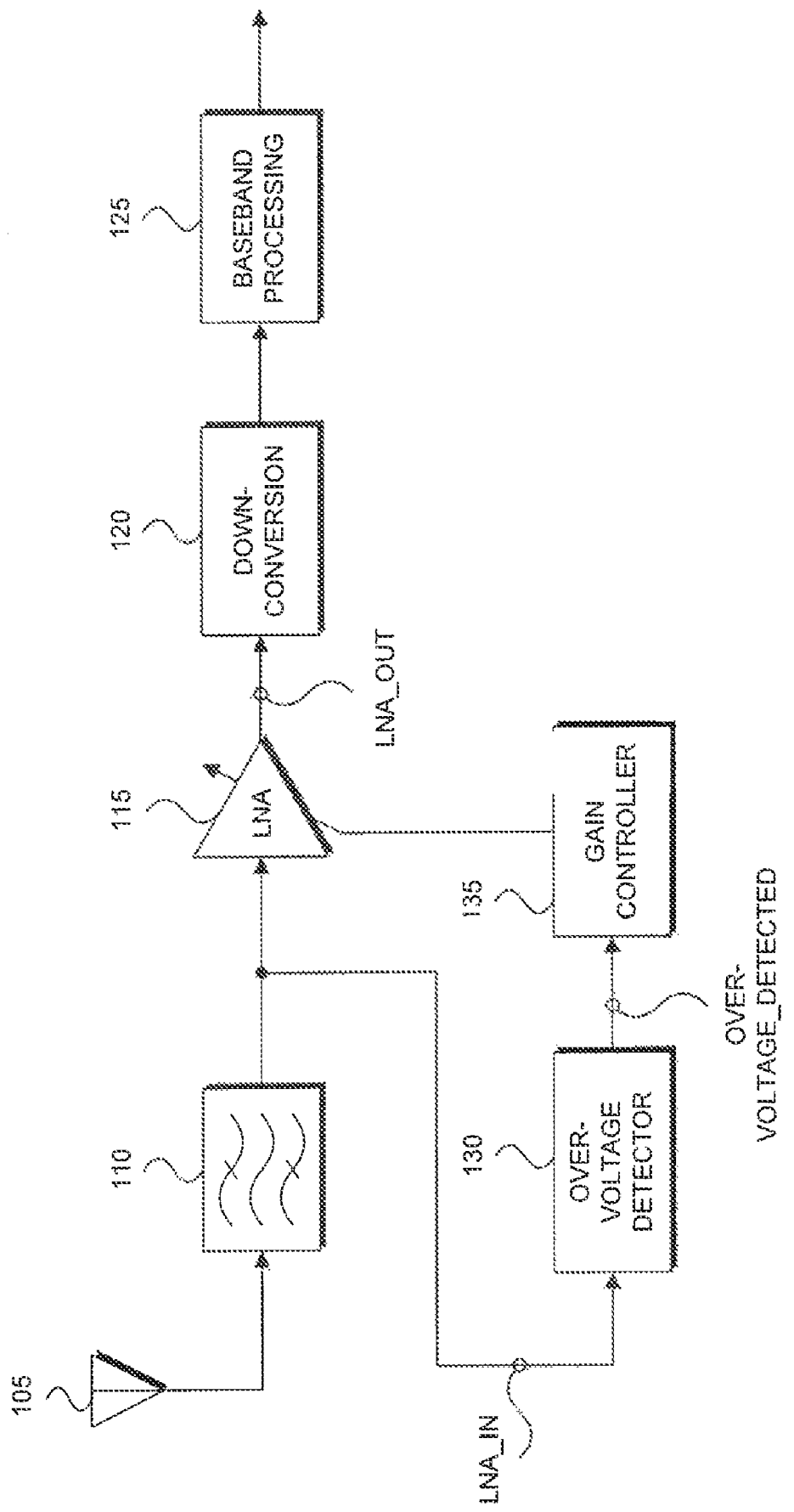
FIG. 1 illustrates a RF receiver that utilizes a peak detector to protect a LNA of the receiver from large in-band interferers, according to embodiments of the present invention.

FIG. 1 illustrates an exemplary RF receiver 100 that utilizes an over-voltage detector to protect a LNA from large in-band interferers, according to embodiments of the present invention. RE receiver 100 includes an antenna 105, a band-pass filter 110, a LNA 115, at least one down-conversion stage 120, and a baseband processing stage 125.

In operation, RF receiver 100 receives at antenna 105 a RF signal that includes a desired channel. In an embodiment, the desired channel is positioned within a frequency band defined by a particular communications standard. For example, the desired channel can be positioned within a frequency band defined by the GSM standard, such as the GSM-850 band, the Extended GSM-900 (E-GSM-900) band, the Digital Cellular System 1800 (DCS-1800) band, or the Personal Communications Services 1900 (PCS-1900) band.

After being received by antenna 105, the RF signal is provided to band-pass filter 110 to attenuate interferers outside the band containing the desired channel. In one embodiment, band-pass filter 110 is a mechanically-resonant device, such as surface acoustic wave (SAW) filter, that provides a high quality factor (Q) required by many of today's communication standards (e.g., GSM). In another embodiment, band-pass filter 110 is a high-Q RF filter integrated on a semiconductor substrate.

After having undergone filtering by band-pass filter 110, the RF signal is provided to LNA 115. LNA 115 provides sufficient amplification to the desired channel of the RF signal to overcome the noise of subsequent stages. The amplified RF signal is provided at LNA output 165 for further processing (e.g., frequency conversion and baseband processing) by down-conversion stage 120 and baseband processing stage 125.

Although band-pass filter 110 can provide excellent attenuation of large out-of-band interferers and accurate pass-band location, it does not protect RF receiver 100 from in-band interferers. Therefore, portions of RF receiver 100 are susceptible to and can be damaged by large in-band interferers. For example, in many implementations of RF receiver 100, LNA 115, down-conversion stage 120, and baseband processing stage 125 are disposed on a semiconductor substrate. Without attenuation of these large in-band interferers, before reaching the semiconductor substrate, devices (e.g., transistors) disposed on and within the semiconductor substrate can be exposed to over-voltages; that is, voltages above design limits. These over-voltage situations can accelerate aging and/or result in breakdown of the devices used to implement RF receiver 100. For example, devices used to implement LNA 115 are particularly vulnerable to large in-band interferers. Breakdown of these devices can, in a worst case scenario, result in an unrecoverable failure of RF receiver 100.

To overcome this potential issue, RF receiver 100 further includes an over-voltage detector 130 and a gain controller 135. Over-voltage detector 130 is configured to process the RF signal received at the input of LNA 115 to detect a peak voltage of the RF signal over a given period of time and compare the detected peak voltage to a given threshold value. The threshold value determines the voltage level of the RF signal that exceeds acceptable limits. The threshold value can be set at a particular value to prevent LNA 115 from being exposed to over-voltage situations that can accelerate aging and/or result in breakdown of devices used to implement LNA 115. In an embodiment, the threshold value is programmable and can be set to any one of a number of different values.

If over-voltage detector 130 determines that the peak voltage of the RF signal over a given period of time is greater than the given threshold value, over-voltage detector 130 can signal to gain controller 135 to reduce a gain of LNA 115 (or completely shut down LNA 115). By reducing a gain of LNA 115, LNA 115 can potentially be spared from being exposed to over-voltage situations.

In one embodiment, the gain of LNA 115 can be reduced by gain controller 135 to any one of a number of different levels. For example, and in one embodiment, the gain of LNA 115 can be reduced by gain controller 135 to a minimum gain level or a zero gain level when directed by over-voltage detector 130 to reduce the gain. In another embodiment, the gain of LNA 115 can be reduced for a pre-determined amount of time. After the pre-determined amount of time has elapsed, gain controller 135 can increase the gain of LNA 115 back to a normal operating gain level or back to the original gain level prior to being reduced. In yet another embodiment, gain controller 135 can increase the gain of LNA 115 back to a normal operating gain level, or back to the original gain level prior to being reduced, after over-voltage detector 130 further determines that the peak of the RF signal over a given period of time has fallen below a second threshold value. The second threshold value can be set at a value that is less than the threshold value used by over-voltage detector 130 to determine that the voltage level of the RF signal exceeds acceptable limits.

It should be noted that, although signal lines between functional blocks illustrated in FIG. 1 are shown as being single-ended, one of ordinary skill in the art will appreciate that one or more of the signal lines and functional blocks can be made differential. For example, LNA 115 can be made to be differential and can receive a differential input from band-pass filter 110 and provide a differential output to down-conversion stage 120.

Figure 2:
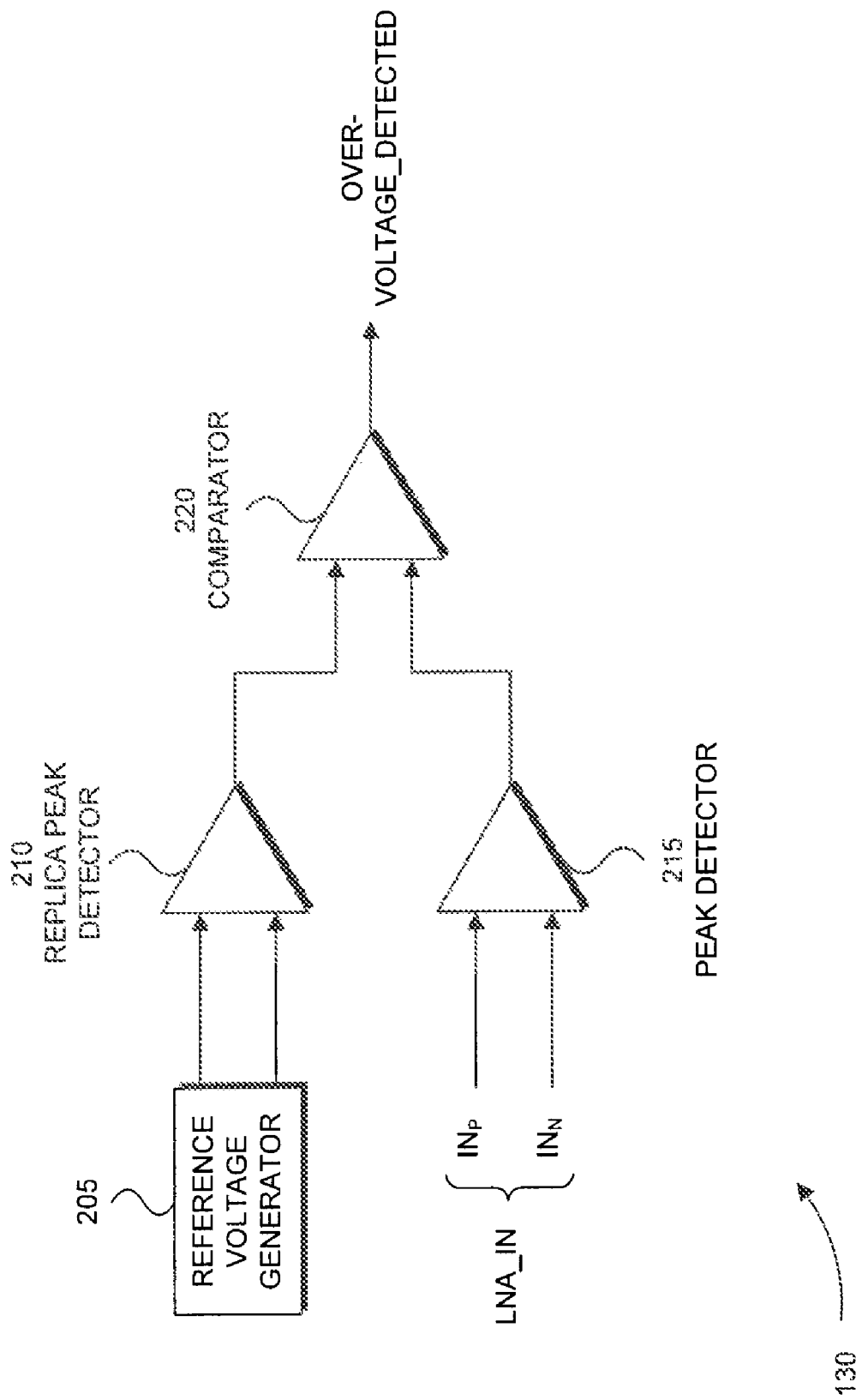
FIG. 2 illustrates a peak detector, according to embodiments of the present invention.

Referring now to FIG. 2, an exemplary implementation of over-voltage detector 130 is illustrated, according to embodiments of the present invention. As illustrated in FIG. 2, over-voltage detector 130 includes a reference voltage generator 205, a replica peak detector 210, a peak detector 215, and a comparator 220.

Peak detector 215 is coupled to the input of LNA 115 (labeled as LNA_IN) and is configured to process the RF signal received by LNA 115. More specifically, peak detector 215 is configured to process the RF signal received by LNA 115 to detect a peak voltage of the RF signal over a given period of time. The detected peak voltage of the RF signal is provided to one input of comparator 220.

The other input of comparator 220 is coupled to the output of replica peak detector 210. In an embodiment, replica peak detector 210 is configured to have a substantially similar structure as peak detector 215. By implementing replica peak detector 210 with a substantially similar structure as peak detector 215, the effects on the operation of peak detector 215 caused by process variants and changes in temperature can be substantially canceled. This is because replica peak detector 215 will experience similar effects due to process variants and changes in temperature as peak detector 215. In another embodiment, replica peak detector 210 can be implemented using smaller devices (e.g., transistors with smaller channel width to channel length ratios) than those used to implement peak detector 215 to reduce power consumption.

Referring now to its specific operation, replica peak detector 210 is configured to receive a reference voltage from reference voltage generator 210 and provide a threshold value to comparator 220. More specifically, replica peak detector 210 is configured to process the reference voltage received, from reference voltage generator 210 (which can be substantially constant) to detect a peak voltage of the reference voltage over a given period of time. The peak voltage detected is provided at the output of replica peak detector 210 and is used as the threshold value to determine when the voltage level of the RF signal exceeds acceptable limits. The reference voltage provided by reference voltage generator 205 can be set at a particular value to prevent LNA 115 from being exposed to over-voltage situations that can accelerate aging and/or result in breakdown of devices used to implement LNA 115. In an embodiment, reference voltage generator 205 can be programmed to provide any one of a number of different reference voltages to adjust the threshold value.

Comparator 220 is configured to compare the threshold value, provided by replica peak detector 210, to the detected peak voltage of the RF signal provided by peak detector 215. If the detected peak voltage of the RF signal provided by peak detector 215 is greater than the threshold value provided by replica peak detector 210, comparator 220 is configured to provide an output signal indicating that a potential over-voltage situation has been detected and the gain of LNA 115 should be reduced (or LNA 115 should be completely shut down). If, on the other hand, the detected peak voltage of the RF signal provided by peak detector 215 is less than the threshold value provided by replica peak detector 210, comparator 220 is configured to provide an output signal indicating that no potential over-voltage situation has been detected.

In an embodiment, gain controller 135 can increase the gain of LNA 115 back to a normal operating gain level, or back to the original gain level prior to being reduced, after over-voltage detector 130 further determines that the peak of the RF signal over a given period of time has fallen below a second threshold value. In order to provide the second threshold value, reference voltage generator 205 can be adjusted to reduce the reference voltage used to detect the original over-voltage situation.

Figure 3:
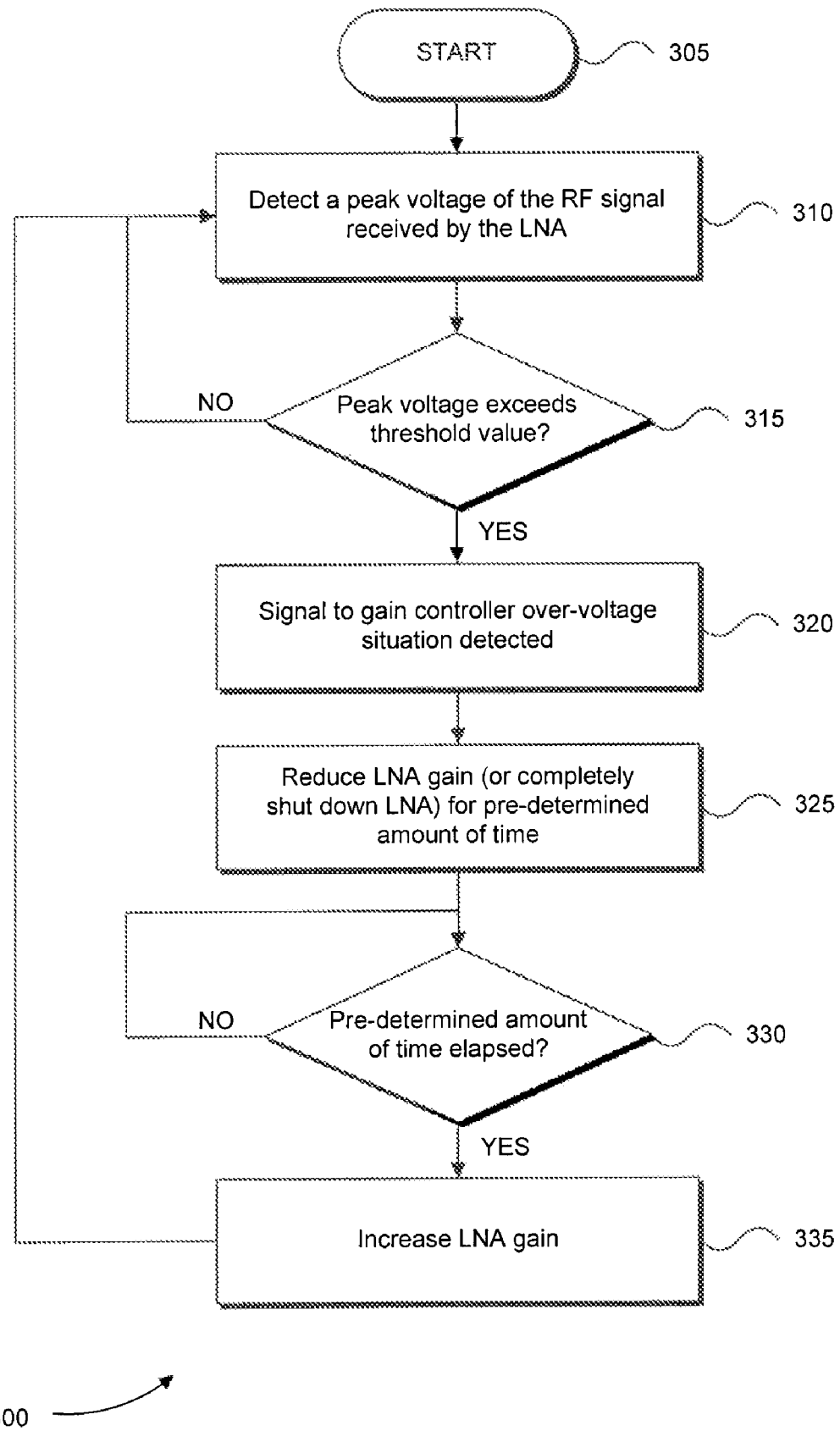
FIG. 3 illustrates a method for operating a RF receiver that utilizes a peak detector to protect a LNA of the receiver from large in-band interferers, according to embodiments of the present invention.

FIG. 3 illustrates a flowchart 300 of a method for operating a RF receiver that utilizes a peak detector to protect a LNA of the receiver from large in-band interferers, according to embodiments of the present invention. Flowchart 300 is described with continued reference to the exemplary operating environment depicted in FIG. 1. However, flowchart 300 is not limited to that embodiment.

Flowchart 300 starts at step 305 and transitions to step 310. In step 310, over-voltage detector 130 monitors the RF signal received at the input of LNA 115 to detect a peak voltage of the RF signal.

In step 315, over-voltage detector 130 determines whether the detected peak voltage exceeds the threshold value. The threshold value can be set at a particular value to prevent LNA 115 from being exposed to over-voltage situations that can accelerate aging and/or result in breakdown of devices used to implement LNA 115. If the detected peak does not exceed the threshold value, flowchart 300 transitions back to step 310. If, on the other hand, the detected peak exceeds the threshold value, flowchart 300 transitions to step 320.

In step 320, over-voltage detector 130 signals to gain controller 135 that an over-voltage situation has been detected.

In step 325, gain controller 135 reduces the gain of LNA 115 (or completely shuts down LNA 115) for a pre-determined amount of time. By reducing a gain of LNA 115 (or completely shutting down LNA 115), LNA 115 can potentially be spared from being exposed to an over-voltage situation.

In step 330, a determination is made as to whether the pre-determined amount of time has elapsed. If the pre-determined amount of time has not elapsed, flowchart 300 remains at step 330. If, on the other hand, the pre-determined amount of time has elapsed, flowchart 300 transitions to step 335.

In step 335, gain controller 135 increases the gain of LNA 115 back to a normal operating gain level or back to the original gain level prior to being reduced.

It should be noted that, in another embodiment of flowchart 300, rather than reducing the gain for a pre-determined amount of time and then increasing the gain after the pre-determined amount of time has elapsed, gain controller 135 can increase the gain of LNA 115 back to a normal operating gain level, or back to the original gain level prior to being reduced, after over-voltage detector 130 further determines that the peak of the RF signal over a given period of time has fallen below a second threshold value. The second threshold value can be set at a value that is less than the threshold value used by over-voltage detector 130 to determine that the voltage level of the RF signal exceeds acceptable limits.

Figure 4:
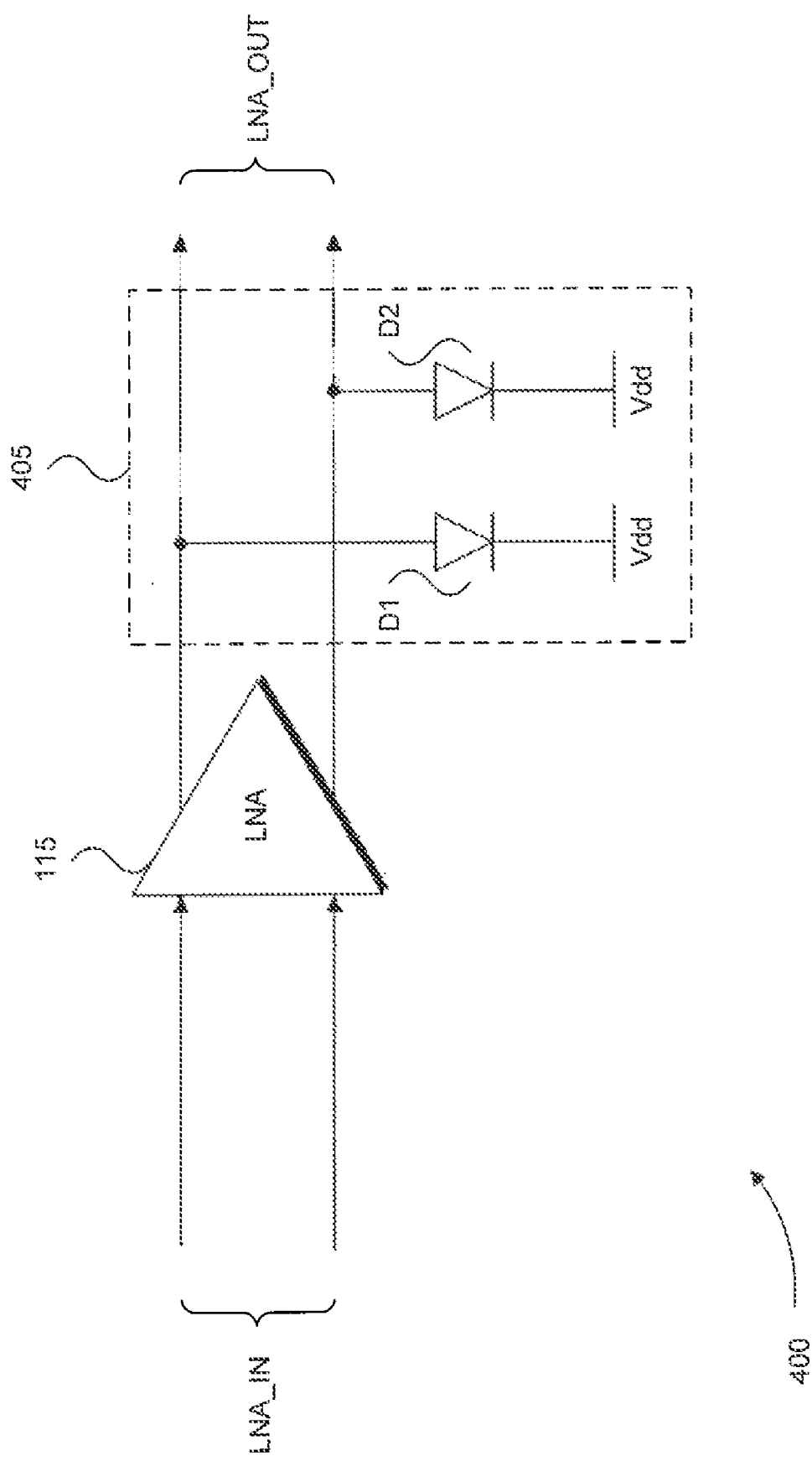
FIG. 4 illustrates a LNA of a RF receiver that utilizes a clamping device to protect the LNA from large in-band interferers, according to embodiments of the present invention.

FIG. 4 illustrates LNA 115 of FIG. 1 utilizing a clamping device 405 to protect LNA 115 from large in-band interferers, according to embodiments of the present invention. Clamping device 405 can be used in addition to, or as an alternative to, over-voltage detector 130 and gain controller 135 illustrated in FIG. 1.

In operation, clamping circuit 405 protects the circuitry of LNA 115, disposed on and within a semiconductor substrate, by shunting large positive voltage signals on both ends of the differential output of LNA 115 (labeled as LNA_OUT in FIG. 4) to ground. Clamping circuit 405 includes diodes D1 and D2.

The anode of diode D1 is coupled to a positive end of the differential output of LNA 115 and the cathode of diode D1 is coupled to a positive voltage Vdd. Diode D1 is reverse biased when the anode of diode D1 is at a voltage potential less than $V_{DIODE}$+Vdd, where $V_{DIODE}$ represents the turn-on voltage of diode D1. In an embodiment, $V_{DIODE}$ is approximately equal to +0.6 V. During normal operation, the positive end of the differential output of LNA 115 has a voltage potential below $V_{DIODE}$+Vdd. Therefore, diode D1 is reverse biased during normal operation of LNA 115. Diode D1 appears as a high-impedance element (i.e., an open circuit) when diode D1 is reverse biased.

Diode D1 is forward biased when the anode of diode D1, coupled to the positive end of the differential output of LNA 115, is at a voltage potential greater than $V_{DIODE}$+Vdd. Diode D1 appears as a low-impedance element when diode D1 is forward biased. Diode D1 will be forward biased when large, positive signals are provided at the positive end of the differential output of LNA 115.

As further illustrated in FIG. 4, the anode of diode D2 is coupled to a negative end of the differential output of LNA 115 and the cathode of diode D2 is coupled to a positive voltage Vdd. Diode D2 is reverse biased when the anode of diode D2 is at a voltage potential less than $V_{DIODE}$+Vdd, where $V_{DIODE}$ represents the turn-on voltage of diode D2. In an embodiment, $V_{DIODE}$ is approximately equal to +0.6 V. During normal operation, the negative end of the differential output of LNA 115 has a voltage potential below $V_{DIODE}$+Vdd. Therefore, diode D2 is reverse biased during normal operation of LNA 115. Diode D2 appears as a high-impedance element (i.e., an open circuit) when diode D2 is reverse biased.

Diode D2 is forward biased when the anode of diode D2, coupled to the negative end of the differential output of LNA 115, is at a voltage potential greater than $V_{DIODE}$+Vdd. Diode D2 appears as a low-impedance element when diode D2 is forward biased. Diode D2 will be forward biased when large, positive signals are provided at the negative end of the differential output of LNA 115.

Figure 5:
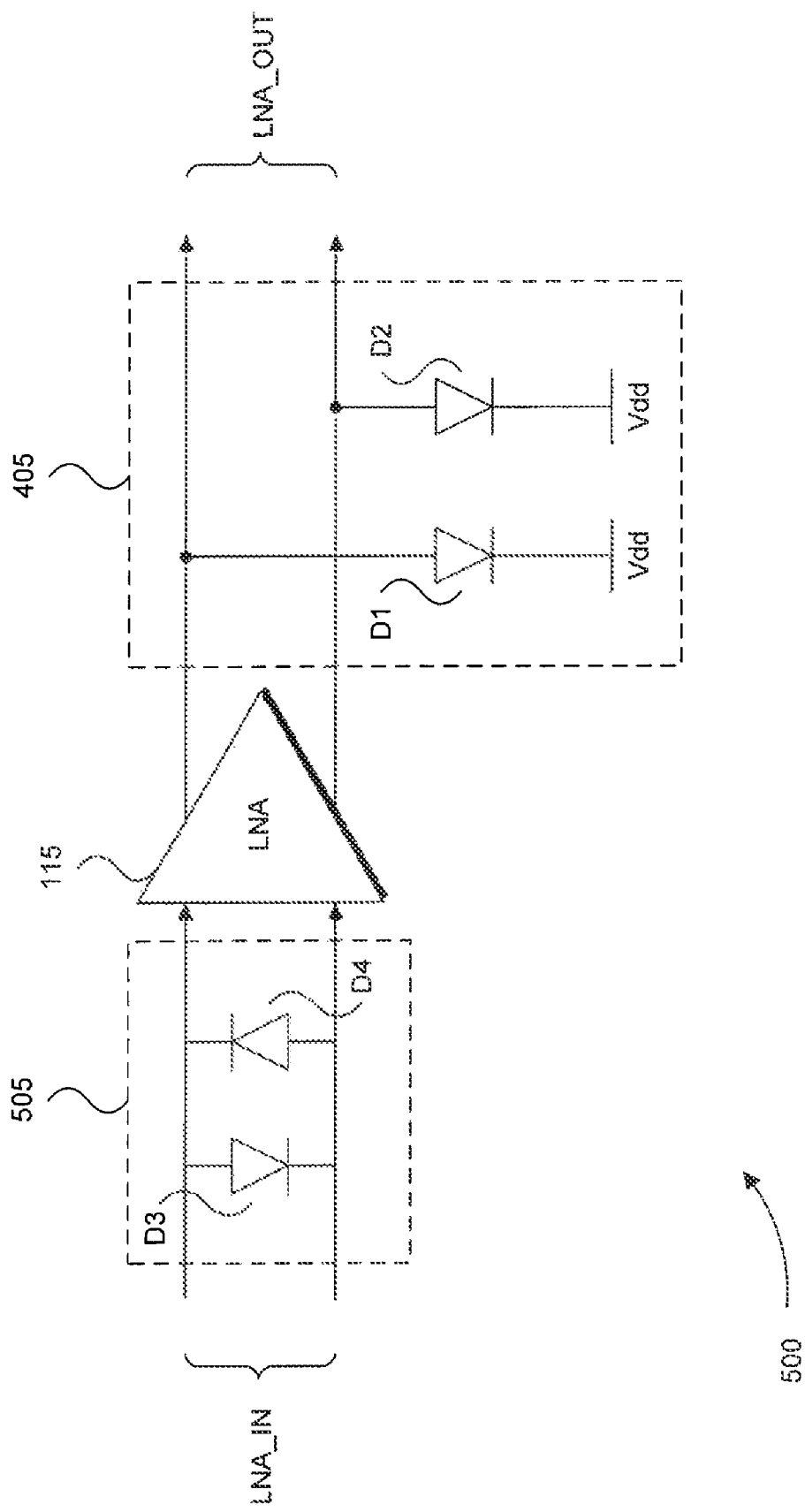
FIG. 5 illustrates a LNA of a RF receiver that utilizes two clamping devices to protect the LNA from large in-band interferers, according to embodiments of the present invention.

Although clamping circuit 405 can provide effective protection of LNA 115, clamping circuit 505 illustrated in FIG. 5 can be further implemented to provide additional protection. Clamping circuit 505 is implemented across the differential input of LNA 115 (labeled as LNA_IN in FIG. 5) and can further protect LNA 115 by providing a path for large positive and negative differential voltage signals on the differential input of LNA 115.

Clamping circuit 505 includes diodes D3 and D4 coupled between the two ends of the differential input of LNA 115. The anode of diode D3 is coupled to the positive-end of the differential input of LNA 115 and the cathode of diode D3 is coupled to the negative-end of the differential input of LNA 115. Diode D3 is reverse biased when the differential voltage, applied across its anode and its cathode, is at a voltage potential less than $V_{DIODE}$, where $V_{DIODE}$ represents the turn-on voltage of diode D2. In an embodiment, $V_{DIODE}$ is approximately equal to +0.6 V. During normal operation, the differential signal coupled to the differential input of LNA 115, has a differential voltage potential below $V_{DIODE}$. Therefore, diode D3 is reverse biased during normal operation of LNA 115. Diode D3 appears as a high-impedance element (i.e., an open circuit) when reverse biased.

Diode D3 is forward biased when the differential signal (voltage at its anode minus the voltage at its cathode) is greater than $V_{DIODE}$. Diode D3 appears as a low-impedance element when forward biased. Diode D3 will be forward biased when large, positive differential signals are coupled to the differential input of LNA 115.

As further illustrated in FIG. 5, the anode of diode D4 is coupled to the negative-end of the differential input of LNA 115 and the cathode of diode D4 is coupled to the positive-end of the differential input of LNA 115. Diode D4 is reverse biased when the differential voltage, applied across its anode and its cathode, is at a voltage potential less than $V_{DIODE}$, where $V_{DIODE}$ represents the turn-on voltage of diode D4. In an embodiment, $V_{DIODE}$ is approximately equal to +0.6 V. During normal operation, the differential signal coupled to the differential input of LNA 115, has a differential voltage potential below $V_{DIODE}$. Therefore, diode D4 is reverse biased during normal operation of LNA 115. Diode D4 appears as a high-impedance element (i.e., an open circuit) when reverse biased.

Diode D4 is forward biased when the differential signal (voltage at its anode minus the voltage at its cathode) is greater than $V_{DIODE}$. Diode D4 appears as a low-impedance element when forward biased. Diode D4 will be forward biased when large, negative differential signals are coupled to the differential input of LNA 115.

Figure 6:
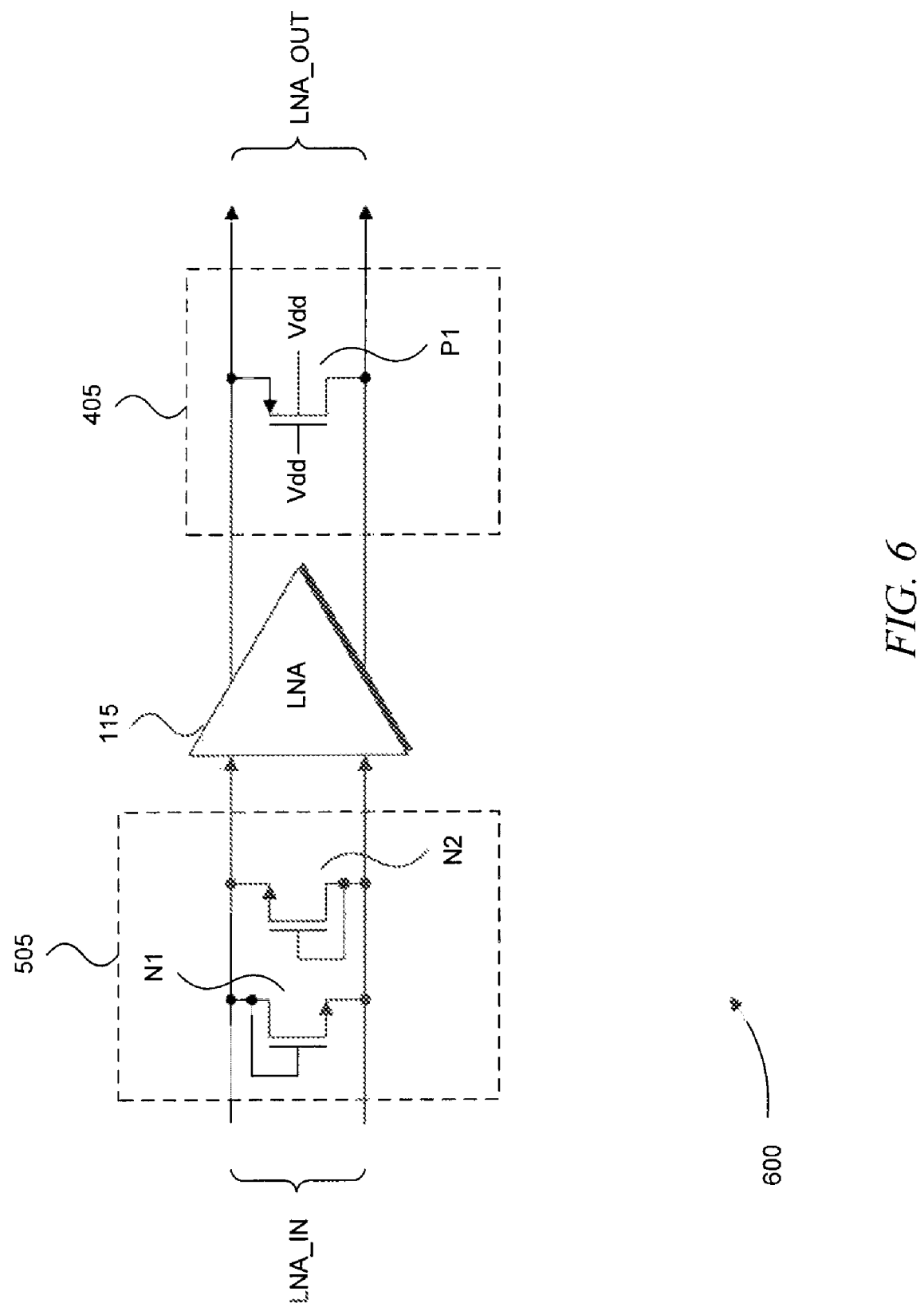
FIG. 6 illustrates a LNA of a RF receiver that utilizes two, metal-oxide semiconductor based clamping devices to protect the LNA from large in-band interferers, according to embodiments of the present invention.

Referring now to FIG. 6, an exemplary implementation 600 of clamping circuits 405 and 505 is illustrated. Specifically, clamping circuits 405 and 505 (and the diodes therein) are implemented using transistor devices.

Clamping circuit 405 includes one transistor P1. In an embodiment, transistor P1 is a metal-oxide semiconductor field effect transistor (MOSFET). Specifically, transistor P1 is a p-channel MOSFET (PMOS). However, as will be appreciated by one of ordinary skill in the art, transistor P1 can be implemented using any suitable transistor technology, including bipolar junction transistors (BJTs) and junction gate field effect transistors (JFETs).

The source of transistor P1 is coupled to the positive end of the differential output of LNA 115, the drain is coupled to the negative end of the differential output of LNA 115, the gate and body are coupled to positive voltage Vdd. This transistor configuration can be referred to as a PMOS junction diode. Transistor P1 is used to implement diodes D1 and D2 illustrated in FIG. 5.

Clamping circuit 505 includes two transistors N1 and N2. In an embodiment, transistors N1 and N2 are MOSFETs. Specifically, transistors N1 and N2 are n-channel MOSFETs (NMOSs). However, as will be appreciated by one of ordinary skill in the art, transistors N1 and N2 can be implemented using any type of transistor (e.g., PMOS) or suitable transistor technology, including bipolar junction transistors (BJTs) and junction gate field effect transistors (JFETs).

The source of transistor N1 is coupled to the negative end of the differential input of LNA 115 and the gate and drain are coupled to the positive end of the differential input of LNA 115. This transistor configuration, where the gate is directly coupled to the drain, is commonly referred to as a diode-connected transistor. Transistor N1 is used to implement diode D3 illustrated in FIG. 5.

The source of transistor N2 is coupled to the positive end of the differential input of LNA 115 and the gate and drain are coupled to the negative end of the differential input of LNA 115. As noted above, this transistor configuration, where the gate is directly coupled to the drain, is commonly referred to as a diode-connected transistor. Transistor N2 is used to implement diode D4 illustrated in FIG. 5.

It will be appreciated that the above described embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals.

It is to be appreciated that the Detailed Description section, and not the Abstract section, is intended to be used in any way.

The present invention has been described above with the aid of functional building blocks illustrating the implementation to interpret the claims. The Abstract section may set forth one or more but not all exemplary embodiments of the present invention as contemplated by the inventor(s), and thus, is not intended to limit the present invention and the appended claims of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A receiver comprising:
   an integrated circuit terminal configured to couple a received radio frequency (RF) signal to a differential RF signal path;
   a low noise amplifier (LNA) coupled to the differential RF signal path and configured to amplify the RF signal to provide an amplified RF signal at a differential output of the LNA;
   a first clamping circuit coupled to the differential output of the LNA and comprising a first diode and a second diode,
   wherein an anode of the first diode is coupled to a positive end of the differential output of the LNA and a cathode of the first diode is coupled to a positive voltage,
   wherein an anode of the second diode is coupled to a negative end of the differential output of the LNA and a cathode of the second diode is coupled to the positive voltage.

2. The receiver of claim 1, wherein the first diode and the second diode are implemented using a p-channel metal oxide semiconductor (PMOS) device, wherein the PMOS device comprises a source terminal, a drain terminal, a gate terminal, and a body terminal.

3. The receiver of claim 2, wherein the source terminal is coupled to the positive end of the differential output of the LNA and the drain terminal is coupled to the negative end of the differential output of the LNA.

4. The receiver of claim 2, wherein the gate terminal and the body terminal are coupled to the positive voltage.

5. The receiver of claim 1, wherein the receiver further comprises:
   a second clamping circuit coupled to the differential RF signal path and comprising a third diode and a fourth diode.

6. The receiver of claim 5, wherein an anode of the third diode is coupled to a positive end of the differential RF signal path and a cathode of the third diode is coupled to a negative end of the differential RF signal path.

7. The receiver of claim 5, wherein an anode of the fourth diode is coupled to a negative end of the differential RF signal path and a cathode of the fourth diode is coupled to a positive end of the differential RF signal path.

8. The receiver of claim 5, wherein the third diode is implemented using a diode-connected metal oxide semiconductor (MOS) device and the fourth diode is implemented using a diode-connected MOS device.

9. The receiver of claim 1, further comprising:
   an over-voltage detector coupled to the RF signal path and configured to determine if a peak of the RF signal exceeds a first threshold; and
   a gain controller configured to reduce a gain of the LNA if the peak of the RF signal exceeds the first threshold as determined by the over-voltage detector.

10. A receiver comprising:
    an integrated circuit terminal configured to couple a received radio frequency (RF) signal to a differential RF signal path;
    a low noise amplifier (LNA) coupled to the differential RF signal path and configured to amplify the RF signal to provide an amplified RF signal at a differential output of the LNA;
    a first clamping circuit coupled to the differential output of the LNA and comprising a first diode and a second diode implemented using a metal oxide semiconductor (MOS) device,
    wherein an anode of the first diode is coupled to a positive end of the differential output of the LNA and a cathode of the first diode is coupled to a positive voltage,
    wherein an anode of the second diode is coupled to a negative end of the differential output of the LNA and a cathode of the second diode is coupled to the positive voltage.

11. The receiver of claim 10, wherein the MOS device is a p-channel MOS device comprising a source terminal, a drain terminal, a gate terminal, and a body terminal.

12. The receiver of claim 11, wherein the source terminal is coupled to the positive end of the differential output of the LNA and the drain terminal is coupled to the negative end of the differential output of the LNA.

13. The receiver of claim 11, wherein the gate terminal and the body terminal are coupled to the positive voltage.

14. The receiver of claim 10, wherein the receiver further comprises:
    a second clamping circuit coupled to the differential RF signal path and comprising a third diode and a fourth diode.

15. The receiver of claim 14, wherein an anode of the third diode is coupled to a positive end of the differential RF signal path and a cathode of the third diode is coupled to a negative end of the differential RF signal path.

16. The receiver of claim 14, wherein an anode of the fourth diode is coupled to a negative end of the differential RF signal path and a cathode of the fourth diode is coupled to a positive end of the differential RF signal path.

17. The receiver of claim 14, wherein the third diode is implemented using a diode-connected metal oxide semiconductor (MOS) device and the fourth diode is implemented using a diode-connected MOS device.

18. The receiver of claim 10, further comprising:
an over-voltage detector coupled to the RF signal path and configured to determine if a peak of the RF signal exceeds a first threshold; and
a gain controller configured to reduce a gain of the LNA if the peak of the RF signal exceeds the first threshold as determined by the over-voltage detector.

* * * * *